(12) United States Patent
Koyama et al.

(10) Patent No.: US 6,812,136 B2
(45) Date of Patent: Nov. 2, 2004

(54) METHOD OF MAKING A SEMICONDUCTOR DEVICE HAVING A MULTILAYER METAL FILM OF TITANIUM/TITANIUM NITRIDE/ TUNGSTEN/TUNGSTEN CARBIDE

(75) Inventors: Mitsutoshi Koyama, Yokkaichi (JP); Toshio Shimizu, Zama (JP); Takeshi Kubota, Ichikawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/799,674

(22) Filed: Mar. 7, 2001

(65) Prior Publication Data

US 2001/0010401 A1 Aug. 2, 2001

Related U.S. Application Data

(63) Continuation of application No. 08/950,756, filed on Oct. 15, 1997, now abandoned.

(30) Foreign Application Priority Data

Oct. 18, 1996 (JP) ............................................ 8-276182

(51) Int. Cl.[7] ......................................... H01L 21/4763
(52) U.S. Cl. ....................... 438/629; 438/637; 438/646; 438/687; 257/62
(58) Field of Search ................... 257/62, 762; 438/629, 438/637, 646, 687

(56) References Cited

U.S. PATENT DOCUMENTS

| | | | | |
|---|---|---|---|---|
| 4,910,169 A | * | 3/1990 | Hoshino | 257/741 |
| 4,985,750 A | | 1/1991 | Hoshino | 257/761 |
| 5,143,867 A | | 9/1992 | D'Heurle et al. | 438/660 |
| 5,391,517 A | * | 2/1995 | Gelatos et al. | 438/643 |
| 5,409,862 A | * | 4/1995 | Wada et al. | 438/607 |
| 5,654,232 A | * | 8/1997 | Gardner | 438/661 |
| 5,656,858 A | | 8/1997 | Kondo et al. | 257/737 |
| 5,714,418 A | | 2/1998 | Bai et al. | 438/627 |
| 5,731,245 A | | 3/1998 | Joshi et al. | 438/705 |
| 6,339,020 B1 | * | 1/2002 | Weihs et al. | 257/750 |

FOREIGN PATENT DOCUMENTS

| | | |
|---|---|---|
| JP | 63-301548 | 12/1988 |
| JP | 5-102152 | 4/1993 |
| JP | 08-288389 | 11/1996 |
| WO | WO-00/01006 A1 * | 1/2000 |

OTHER PUBLICATIONS

English-language translation of Office Action dated Apr. 27, 2004, from the Japanese Patent Office in Japanese Application No. 8-276182.

* cited by examiner

Primary Examiner—Long Pham
Assistant Examiner—Howard Weiss
(74) Attorney, Agent, or Firm—Finnegan, Henderson, Farabow, Garrett & Dunner, L.L.P.

(57) ABSTRACT

According to the present invention, when a wiring layer using copper is formed, an interlayer insulation film is formed on a semiconductor substrate having a conductive portion of an element. A contact hole, which is connected to at least the conductive portion, is formed in the interlayer insulation film. A wiring groove is formed in the surface of the interlayer insulation film including a region where the contact hole is formed. A barrier metal having a tungsten carbide film on its surface is formed on the surface of the interlayer insulation film and in the wiring groove and contact hole in contact with the conductive portion. A copper film is then formed on the barrier metal in contact with the tungsten carbide film. After that, the contact hole and wiring groove are completely filled with the copper film by heat treatment. An excess portion is removed from the copper film except in the contact hole and wiring groove thereby to form a copper buried wiring layer. Thus, the copper film is formed in contact with the tungsten carbide film and the wettability of copper to the barrier metal is improved, accordingly, the copper wiring layer can be increased in reliability.

24 Claims, 4 Drawing Sheets

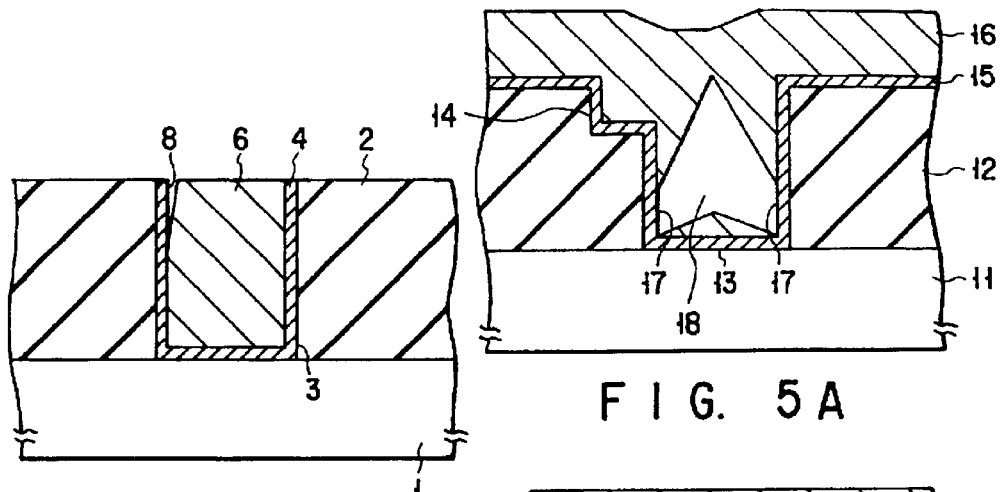
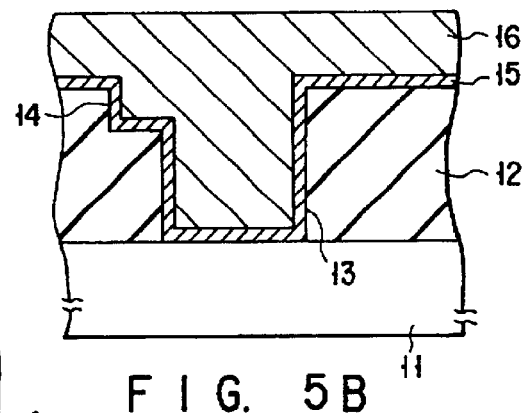
FIG. 5A
FIG. 5B
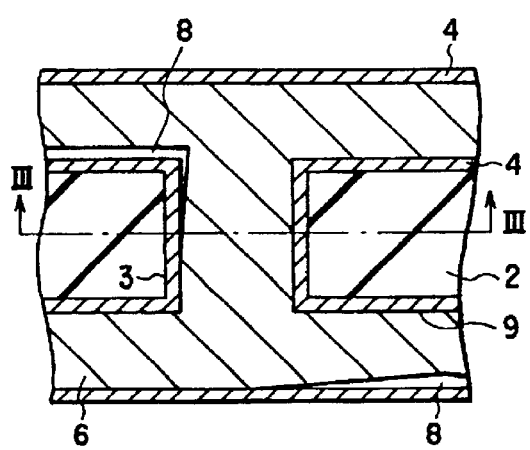
FIG. 3 (PRIOR ART)
FIG. 4 (PRIOR ART)
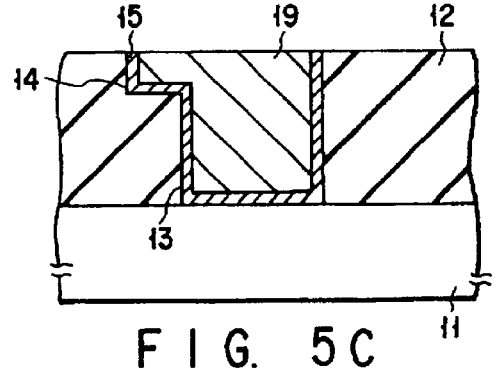
FIG. 5C
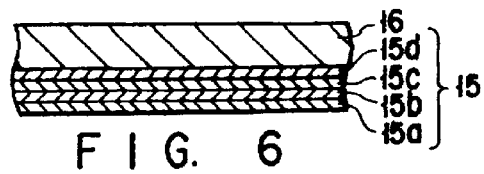
FIG. 6

METHOD OF MAKING A SEMICONDUCTOR DEVICE HAVING A MULTILAYER METAL FILM OF TITANIUM/TITANIUM NITRIDE/ TUNGSTEN/TUNGSTEN CARBIDE

This is a continuation of application Ser. No. 08/950,757, filed Oct. 15, 1997, now abandoned, which is incorporated herein by reference.

BACKGROUND OF THE INVENTION

The present invention relates to a semiconductor device having a wiring layer of copper (Cu) and, more specifically, to a semiconductor device using a metal film, containing copper as a principal ingredient, for filling a hole.

Recently, in a very-high-speed, very-small-sized device, there has been fear of increasing in wiring resistance and decreasing in operation speed due to miniaturization of a wiring layer. At present, the wiring layer is formed of copper whose electric resistance is lower than that of an aluminum (Al) alloy which is commonly used.

The electric resistance R of the wiring layer is expressed by the following equation:

$$R = \rho L / S$$

where L is the length of the wiring layer, S is the area of the cross section of the wiring layer, and ρ is the resistivity proper to metal materials used in the wiring layer. The length L and area S depend upon circuit design.

When a wiring layer is formed, its resistivity ρ and length L have substantially the same values as designed, but the area S does not. In particular, the area S of a cross section of the wiring layer in a contact hole for connecting the wiring layer on an interlayer insulation film with an element region, is not so large, nor is that of the wiring layer in a connecting hole (hereinafter referred to as a via hole) for connecting wiring layers between which an inter-layer insulation film is interposed. This is caused by the fact that a decrease in power supply voltage is not promoted in view of an operation margin of elements and a user's convenience as the wiring layer is decreased in size and, in other words, the interlayer insulation film cannot be thinned so much in consideration of an isolation voltage. As a result, the diameter of a contact hole or a via hole (hereinafter each referred to as a hole) becomes smaller, whereas the depth of the hole remains unchanged; therefore, the aspect ratio, which is a ratio of the depth of the hole to the diameter thereof, is increased.

Since a wiring layer is usually formed in a hole by sputtering a metal film, if the aspect ratio of the hole is high, the coverage of the metal film is deteriorated and the area S of the cross section of the wiring layer in the hole is reduced; accordingly, the wiring layer is increased in electric resistance R. In order to form a low-resistance wiring layer using copper, too, it is important how much the resistance of the wiring layer in the hole is lowered.

There are three methods of forming a wiring layer in a hole. The first method is to bury a metal film such as tungsten (W), which differs from copper, in a hole as a wiring layer. The second method is to grow a copper film from the entire inner wall of a hole by CVD. The third method is to form a copper film by sputtering and then cause copper to flow by heat treatment to fill a hole.

On the other hand, there are two methods as a technique of forming a wiring layer using copper. In the first method, a copper film is formed on the surface of an interlayer insulation film at the same time when a hole is filled, as in the foregoing second and third methods, and an unnecessary portion is removed from the copper film by etching such as RIE to form a pattern of a wiring layer. In the second method, a wiring groove and a hole for a wiring layer is formed in an interlayer insulation film, then a copper film is formed to fill both the wiring groove and the hole, and an unnecessary portion is removed from the copper film on the interlayer insulation film. In other words, a copper film is left only both in the wiring groove and in the hole to form a wiring layer (hereinafter referred to as a copper buried wiring layer).

When a wiring layer using copper is formed as described above, a barrier metal is required to prevent copper from being diffused into an element region as in the case where a wiring layer is formed using aluminum and, in other words, a barrier metal has to be formed before a copper film is done to prevent copper from reaching its lower element region. It is now considered to use titanium (Ti) or titanium alloy as the barrier metal. In using such metal as a barrier metal, an alloy may be formed in an interface between the barrier metal and copper.

An example of forming the foregoing wiring layer using copper will now be described.

FIGS. 1A to 1C are schematic cross-sectional views illustrating a main part of a semiconductor device in order to explain a prior art manufacturing process of the device.

As illustrated in FIG. 1A, an element or an underlying wiring layer (neither of which is shown) is formed on a silicon substrate 1 and then an interlayer insulation film 2 is formed on the whole surface of the resultant structure. A hole 3, which corresponds to part of the element or an upper portion of the underlying wiring layer (both of which are called a conductive portion) and serves as a contact hole or a via hole, is formed in the interlayer insulation film 2. Though not shown in particular, a wiring groove is formed in the surface of the interlayer insulation film 2 including a region where the hole 3 is formed. After that, a barrier metal 4 is formed of titanium alloy on the entire surface of the interlayer insulation film 2 including the inner portions of the hole 3 and wiring groove. As an example of a metal film using copper, a copper film 5 is formed on the barrier metal 4 by sputtering and CVD.

If the hole 3 or wiring groove is not completely filled with the copper film 5, it is done by heat treatment as shown in FIG. 1B. Subsequently thereto, as illustrated in FIG. 1C, an excess copper film 5 on the surface of the interlayer insulation film 2 is removed, together with its underlying barrier metal 4, by chemical mechanical polishing (CMP). By the process described above, a copper buried wiring layer 6 is formed in the hole 3 and wiring groove with the barrier metal interposed therebetween.

The above-described prior art process of forming a wiring layer using copper, has the following three problems.

The first problem is as follows. If, as shown in FIG. 2A, the surface of the barrier metal 4 has an exposed portion 4a not sufficiently covered with the copper film 5, a void 7 may remain in the hole 3 after heat treatment as shown in FIG. 2B and, in this case, a contact failure will occur or the copper film 5 in the hole 3 will increase in resistance and thus the copper buried wiring layer 6 in the hole 3 will decrease in reliability. The reason is as follows. When the copper is increased in fluidity by the heat treatment, the exposed portion 4a of the barrier metal 4 is covered with the copper film 5 and thus the sum of interface energy caused in the interface between the copper film 5 and barrier metal 4, surface energy of the copper film 5, and surface energy of the barrier metal 4 will increase. In other words, the decrease in reliability is caused by poor wettability and adhesion between the copper and barrier metal 4.

The second problem is that when an excess portion is removed from the film 5 by polishing such as CMP to form a copper buried wiring layer 6, exfoliation 8 may be caused by mechanical action such as polishing between the copper buried wiring layer 6 and barrier metal 4 as illustrated in FIG. 3. This exfoliation 8 is due to poor adhesion between copper and barrier metal 4. Like the first problem, the second problem decreases the reliability of the copper buried wiring layer 6.

The third problem is that exfoliation occurs in the copper buried wiring layer 6 after a semiconductor pellet is resin-molded formed through the above process. FIG. 4 is a top view of FIG. 3. For example, when a heat cycle test is carried out at room temperature and at a temperature of about 100° C., exfoliation 8 will occur between the copper buried wiring layer 6 and barrier metal 4 in the hole 3 and wiring groove 9. This exfoliation is also due to poor adhesion between copper and barrier metal 4; accordingly, like the second problem, the third problem decreases the reliability of the copper buried wiring layer 6.

BRIEF SUMMARY OF THE INVENTION

As described above, the prior art semiconductor device has a problem in which a copper buried wiring layer is decreased in reliability because of poor adhesion between copper and barrier metal though a low-resistance wiring layer is formed using copper.

It is accordingly an object of the present invention to provide a semiconductor device having a wiring layer using copper and improved in reliability.

To attain the object, according to a first aspect of the present invention, there is provided a semiconductor device comprising:

a semiconductor substrate;

a carbide of refractory metal formed above the semiconductor substrate; and a metal film formed on the carbide and containing copper as a principal ingredient.

According to a second aspect of the present invention, there is provided a semiconductor device comprising:

a semiconductor substrate;

a multilayer metal film formed above the semiconductor substrate and having a tungsten carbide film on a surface thereof; and a metal film formed on the multilayer metal film in contact with the tungsten carbide film and containing copper as a principal ingredient.

According to a third aspect of the present invention, there is provided a semiconductor device comprising:

a semiconductor substrate having a conductive portion on a surface thereof;

an interlayer insulation film provided on an entire surface of the semiconductor substrate;

a multilayer metal film having a tungsten carbide film on a surface thereof and provided in a hole formed through the interlayer insulation film and corresponding to the conductive portion and in a wiring groove formed in the surface of the interlayer insulation film including a region where the hole is formed, at least part of the multilayer metal film contacting the conductive portion; and a metal film buried in at least the hole and the wiring groove, with the multilayer metal film therebetween, and containing copper as a principal ingredient.

According to a fourth aspect of the present invention, there is provided a semiconductor device comprising:

a semiconductor substrate having a conductive portion on a surface thereof;

an interlayer insulation film provided on an entire surface of the semiconductor substrate;

a multilayer metal film having a tungsten carbide film on a surface thereof and provided in a hole formed through the interlayer insulation film and corresponding to the conductive portion, the multilayer metal film being formed above the interlayer insulation film, and at least part of the multilayer metal film contacting the conductive portion; and a metal film provided in the hole and above the interlayer insulation film, with the multilayer metal film therebetween, and containing copper as a principal ingredient.

With the above constitution of the semiconductor device according to the present invention, the wettability and adhesion of a metal film containing copper as a principal ingredient to a barrier metal can be improved. Therefore, even though the surface of the barrier metal includes an exposed portion which is not sufficiently covered with the metal film, a hole and a groove can completely be filled with the metal film by the subsequent heat treatment.

Since, furthermore, a metal film including copper as a principal ingredient is employed, its electrical resistance is considerably lowered.

If an interlayer insulation film whose dielectric constant ranges from 1 to 3.9 is used, the capacitance between conductive portions can be reduced, which does not hinder a high-speed operation of the semiconductor device.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a schematic cross-sectional view illustrating a main part of a prior art semiconductor device in order to explain a second problem in forming a wiring layer using copper;

FIG. 4 is a schematic cross-sectional view illustrating a main part of a prior art semiconductor device in order to explain a third problem in forming a wiring layer using copper;

FIGS. 5A to 5C are schematic cross-sectional views illustrating a main part of a semiconductor device having a wiring layer using copper according to a first embodiment of the present invention in order to explain a process of manufacturing the device;

FIG. 6 is a schematic cross-sectional view showing an example of a constitution of a barrier metal of the present invention;

DETAILED DESCRIPTION OF THE INVENTION

Figure 1A:
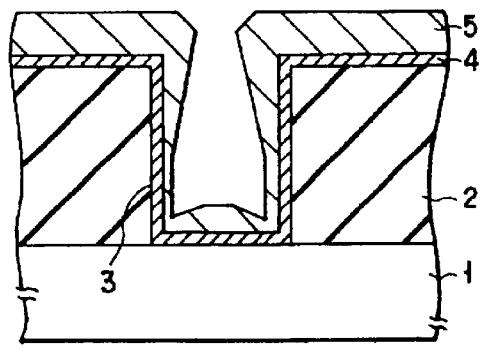
FIGS. 1A to 1C are schematic cross-sectional views illustrating a main part of a prior art semiconductor device in order to explain a method of forming a wiring layer using copper.
Figure 1B:
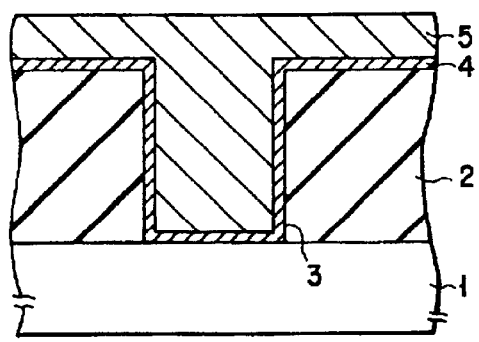

Embodiments of the present invention will now be described with reference to the accompanying drawings.
(First Embodiment)

FIGS. 5A to 5C are schematic cross-sectional views of a principal part of a semiconductor device having a wiring layer using copper according to a first embodiment of the present invention. A process of manufacturing the semiconductor device will now be described with reference to these figures.

As illustrated in FIG. 5A, an element (not shown) is formed on a silicon substrate 11, and an interlayer insulation film 12 having a thickness of about 1.5 μm is formed on the entire surface of the resultant structure and its surface is flattened. After that, a contact hole 15 about 0.5 μm square is formed in the interlayer insulation film 12 above a conductive portion (first layer) of the element by the photoetching process (PEP). More specifically, photoresist (not shown) is formed in part of the film 12 other than a region where the contact hole 13 is to be formed, the film 12 is etched using the photoresist as a mask to form the contact hole 13, and the photoresist is eliminated. A wiring groove 14 of about 0.6 μm in width and about 0.3 μm in depth is formed by the PEP in a region which includes the contact hole 13 and in which a wiring layer is to be formed. The aspect ratio for the opening in the interlayer insulation film is the ratio of its height to width. The height of the opening is the thickness, 1.5 μm, of the insulation film 12, and the maximum width of the opening is the width, 0.6 μm, at the wiring groove 14. These dimensions yield an aspect ratio of 2.5. A barrier metal (which will be described in detail) 15 of a multilayer metal film having tungsten carbide (WC) on its surface, is formed in the contact hole 13 and wiring groove 14 and on the surface of the interlayer insulation film 12 in contact with the conductive portion. A copper film 16 having a thickness of about 0.4 μm serving as a metal film containing at least copper as a principal ingredient, is formed on the barrier metal 15 by sputtering in a vacuum.

As illustrated in FIG. 6, the barrier metal 15 includes a titanium film 15a of about 7 nm in thickness, a titanium nitride (TiN) film 15b of about 15 nm in thickness, a tungsten (W) film 15c of about 10 nm in thickness, and a tungsten carbide film 15d of about 7 nm in thickness contacting the copper film 16, which are formed continuously in a vacuum by the CVD.

Even though the copper film 16 is deposited in the minute contact hole 13 by sputtering, the inner wall of the contact hole 13 is not sufficiently covered or filled with the copper film 16. Therefore, the tungsten carbide film 15d formed under the copper film 16 is partly exposed, that is, there exists an exposed portion 17 on the inner wall of the hole 13.

Subsequently, heat treatment is carried out. The surface of the copper film 16 is irradiated with, for example, an Xe—Cl excimer laser beam to instantaneously melt copper. As shown in FIG. 5B, the copper film 16 is completely buried into the contact hole 13 and wiring groove 14 and, in this case, wettability between the tungsten carbide and copper is considerably good, so that the wettability of the copper is expanded, and all the tungsten carbide film 15d formed on the inner wall of the contact hole 13 is covered with the copper film 16. In other words, the total energy of the structure is lowered by bringing copper and tungsten carbide into close contact with each other. Consequently, as shown in FIG. 5A, the copper film 16 contacting a void 18 is changed such that its surface area is minimized. If the void 18 disappears, the surface energy of the copper film 16 in the hole 13 is minimized or becomes zero, with the result that the total energy of the structure is almost minimal. It is hard to make an alloy of tungsten carbide and copper.

As illustrated in FIG. 5C, an excess portion of the copper film 16, excluding the inner portion of the contact hole 13 and wiring groove 14, is removed by the CMP, as is the barrier metal 15 of a multilayer metal film including the titanium (Ti) film 15a, titanium nitride (TiN) film 15b, tungsten (W) film 15c and tungsten carbide (WC) film 15d. A copper buried wiring layer 19 is thus formed leaving the barrier metal 15 and copper film 16 in the contact hole 13 and wiring groove 14.

Figure 7:
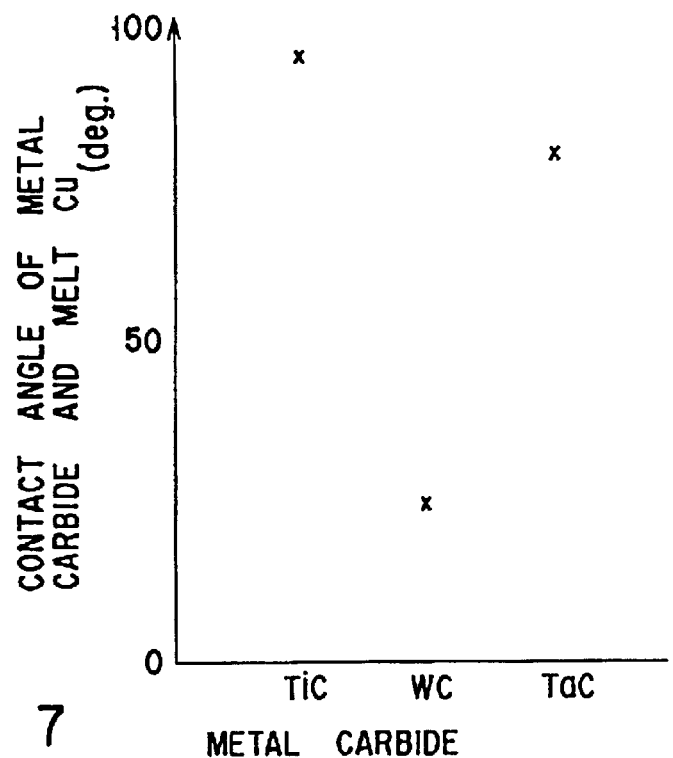
FIG. 7 is a diagram representing the relationship between each of metal carbides and an angle of contact with melt copper.

FIG. 7 shows the wettability of copper by comparing tungsten carbide and other metals such as titanium carbide (TiC) and tantalum carbide (TaC).

Generally it is known to use metal having high surface energy as an underlying layer in order to improve in wettability of copper. The higher the melting point of metal, the higher the surface energy thereof. The surface energy of metal is heightened if the metal is carbonized. The contact angles of the principal metal carbides (TiC, WC and TaC) used for manufacturing a semiconductor device with melt copper, were obtained as follows: The contact angle of TiC with melt copper was about 95°, that of WC with melt copper was about 25°, and that of TaC with melt copper was about 80°. It was clearly understood from these results that the wettability of the melt copper with WC was far superior to TiC and TaC and the embeddability of the melt copper was improved.

According to the first embodiment, the tungsten carbide film 15d of the barrier metal 15 of the multilayer metal film is formed in contact with the copper buried wiring layer 19, so that the wettability and adhesion between metal (WC) of the barrier metal 15 and copper is improved and the void 7 of the prior art (FIG. 2B) does not occur. Even when mechanical force is applied to the copper buried wiring layer 19 and barrier metal 15 in the CMP, the exfoliation 8 of the prior art (FIG. 3) does not occur. Even when heat treatment is repeated in resin-molding, the exfoliation 8 (FIG. 4) does not occur, either. The copper buried wiring layer 19 is therefore improved in reliability.

Figure 8:
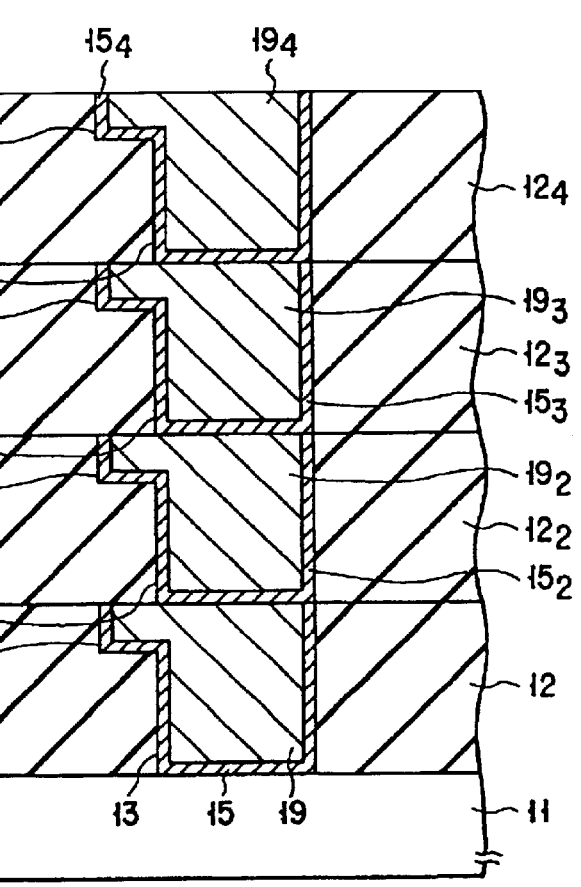
FIG. 8 is a schematic cross-sectional view showing another example of the main part of the semiconductor device according to the first embodiment of the present invention.

In the first embodiment, the above manufacturing process can be repeated as shown in FIG. 8. An interlayer insulation film $12_2$ is formed on the copper buried wiring layer 19 of the first layer (corresponding to a conductive portion of the second layer) by the CVD and flattened. A via hole $13_2$ and a wiring groove $14_2$ are formed in the interlayer insulation film $12_2$ above the copper buried wiring layer 19. A barrier metal $15_2$ of a multilayer metal film containing Ti, TiN, W and WC films and a copper buried wiring layer $19_2$ of the second layer (corresponding to a conductive portion of the third layer) are formed in the via hole $13_2$ and wiring groove $14_2$. A flattened interlayer insulation film $12_3$, a via hole $13_3$ and a wiring groove $14_3$ connected to the copper buried wiring layer $19_2$, a barrier metal $15_3$ including Ti, TiN, W and WC films, and a copper buried wiring layer $19_3$ of the third layer (corresponding to a conductive portion of the fourth layer) can be formed on the copper buried wiring layer $19_2$ of the second layer. Furthermore, a flattened interlayer insulation film $12_4$, a via hole $13_4$ and a wiring groove $14_4$ connected to the copper buried wiring layer $19_3$, a barrier metal $15_4$ including Ti, TiN, W and WC films, and a copper buried wiring layer $19_4$ of the fourth layer (corresponding to a conductive portion of the fifth layer) can be formed on the copper buried wiring layer $19_3$ of the third layer. Similarly, a plurality of copper buried wiring layers are formed and then a passivation film (not shown) is formed.

(Second Embodiment)

Figure 9A:
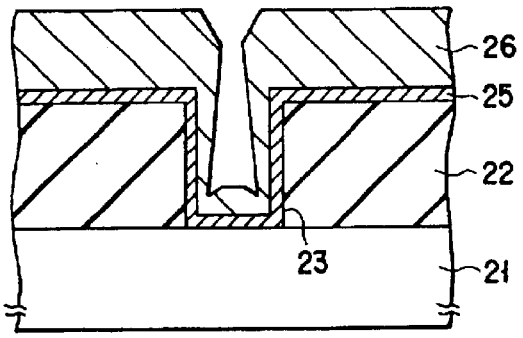
FIGS. 9A to 9C are schematic cross-sectional views illustrating a main part of a semiconductor device having a wiring layer using copper according to a second embodiment of the present invention in order to explain a process of manufacturing the device.
Figure 9B:
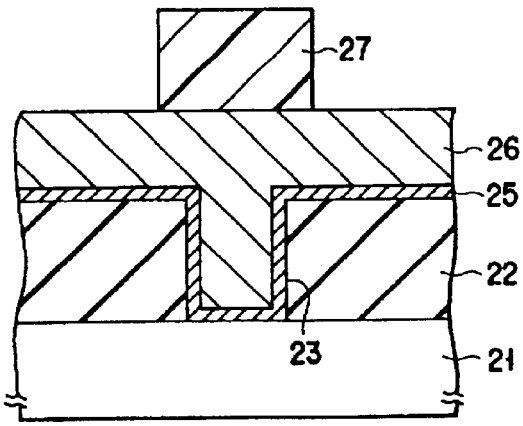
Figure 9C:
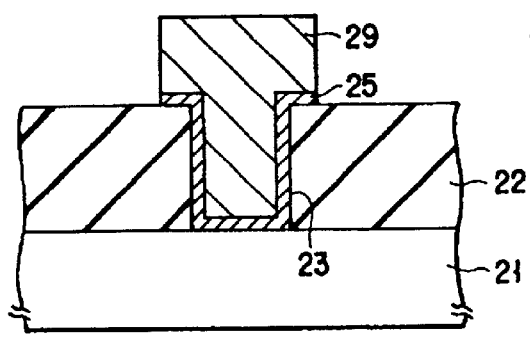

FIGS. 9A to 9C are schematic cross-sectional views of the principal part of a semiconductor device having a wiring layer using copper according to a second embodiment of the present invention. A process of manufacturing the semiconductor device will now be described with reference to these figures.

Referring to FIG. 9A, as in the first embodiment, an element (not shown) is formed on a silicon substrate 21, and an interlayer insulation film 22 having a thickness of about 1.5 $\mu$m is formed on the entire surface of the resultant structure and its surface is flattened. After that, a contact hole 23 about 0.5 $\mu$m square is formed in the interlayer insulation film 22 above a conductive portion (first layer) of the element by the PEP. More specifically, photoresist (not shown) is formed in part of the film 22 other than a region where the contact hole 23 is to be formed, the film 22 etched using the photoresist as a mask to form the contact hole 13, and the photoresist is eliminated. A barrier metal 25, which corresponds to the barrier metal 15 shown in FIG. 6, is formed in the contact hole 23 and on the surface of the interlayer insulation film 22 in contact with the conductive portion by the CVD. A copper film 26 having a thickness of about 1.0 $\mu$m serving as a metal film containing at least copper as a principal ingredient, is formed on the barrier metal 25 by sputtering.

The surface of the copper film 26 is irradiated with an Xe—Cl excimer laser beam to instantaneously melt copper. As shown in FIG. 9B, the copper film 26 is completely buried into the contact hole 23, and a mask 27 is formed by resist in a region of the copper film 26 where a wiring layer is to be formed.

A portion of the copper film 26 except where the mask 27 is formed and its underlying barrier metal 25 are removed by RIE, and then the mask 27. As illustrated in FIG. 9C, a copper wiring layer 29 is formed in the contact hole 23 and on the interlayer insulation film 22, which is close to the contact hole 23, leaving the barrier metal 25 and copper film 26.

Figure 2A:
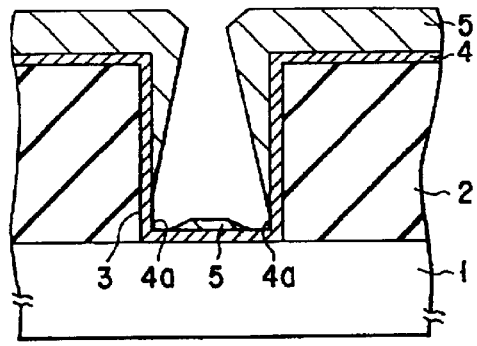
FIGS. 2A and 2B are schematic cross-sectional views illustrating a main part of a prior art semiconductor device in order to explain a first problem in forming a wiring layer using copper.
Figure 2B:
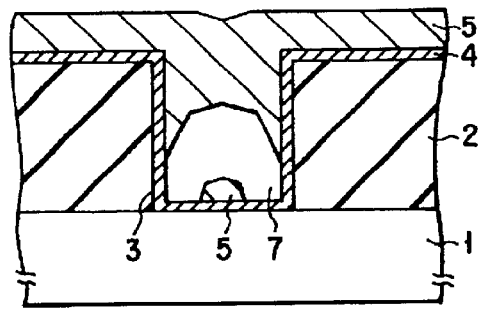
Figure 1C:
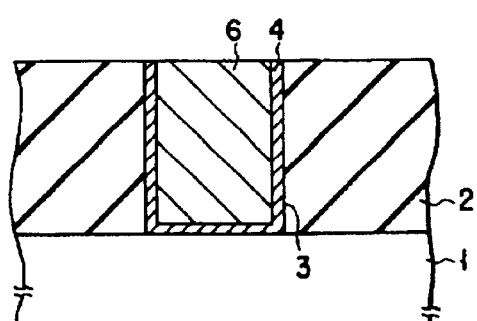

According to the second embodiment, the tungsten carbide film of the barrier metal 25 of the multilayer metal film is formed in contact with the copper wiring layer 29, so that the wettability and adhesion between metal (WC) of the barrier metal 25 and copper is improved and the void 7 of the prior art does not occur (see FIG. 2B). Even when heat treatment is repeated in resin-molding, the exfoliation 8 of the prior art does not occur (see FIG. 4). The copper wiring layer 29 is therefore improved in reliability.

Figure 10:
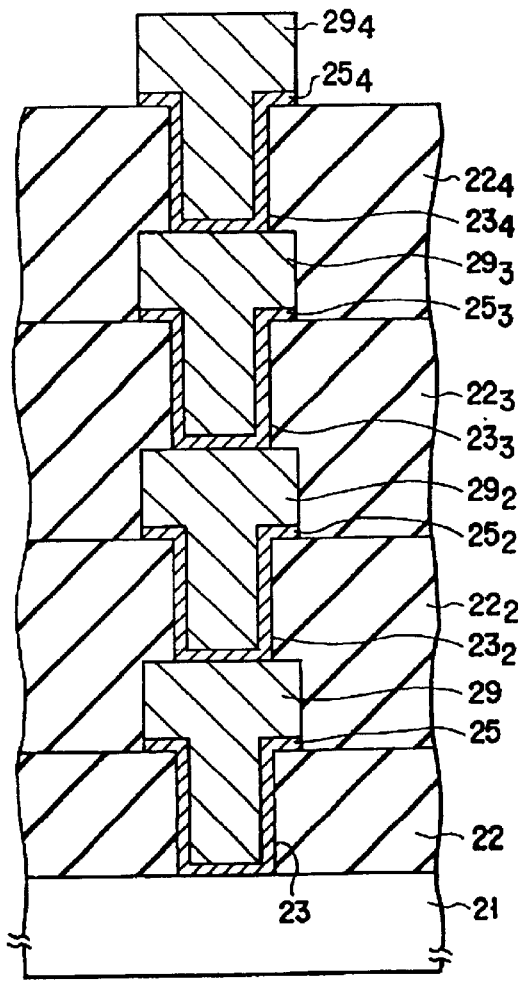
FIG. 10 is a schematic cross-sectional view showing another example of the main part of the semiconductor device according to the second embodiment of the present invention.

In the second embodiment, the above manufacturing process can be repeated as shown in FIG. 10. After the copper wiring layer 29 of the first layer (corresponding to a conductive portion of the second layer) is formed, an interlayer insulation film $22_2$ is formed on the entire surface of the film 29 by CVD and flattened. A via hole $23_2$ is formed in the interlayer insulation film $22_2$ above the copper wiring layer 29. A barrier metal $25_2$ of a multilayer metal film containing Ti, TiN, W and WC films and a copper wiring layer $29_2$ of the second layer (corresponding to a conductive portion of the third layer) are formed in the via hole $23_2$ and its adjacent interlayer insulation film $22_2$. After the copper wiring layer $29_2$ of the second layer is formed, a flattened interlayer insulation film $22_3$, a via hole $23_3$ connected to the copper wiring layer $29_2$, a barrier metal $25_3$ including Ti, TiN, W and WC films, and a copper wiring layer $29_3$ of the third layer (corresponding to a conductive portion of the fourth layer) can be formed on the copper wiring layer $29_2$ of the second layer. Furthermore, a flattened interlayer insulation film $22_4$, a via hole $23_4$ connected to the copper wiring layer $29_3$, a barrier metal $25_4$ including Ti, TiN, W and WC films, and a copper wiring layer $29_4$ of the fourth layer (corresponding to a conductive portion of the fifth layer) can be formed on the copper wiring layer $29_3$ of the third layer. Similarly, a plurality of copper wiring layers are formed and then a passivation film (not shown) is formed.

In the semiconductor devices according to the first and second embodiments, the width of each of the contact hole and via hole is often 0.5 $\mu$m or less in view of miniaturization. Favorably, the size of the hole ranges from 0.4 square $\mu$m to 0.5 square $\mu$m in view of easiness of manufacture.

An interlayer insulation film with a low dielectric constant can be used and, in this case, the capacitance between conductive portions, i.e., between wiring layers and between the element and wiring layer is decreased, which does not hinder the high-speed operation of the semiconductor device. For example, it is favorable that the dielectric constant of the interlayer insulation film be 1.0 or higher and 3.9 or lower. In particular, the dielectric constant is effective when the width of the contact hole or via hole is 0.5 $\mu$m or less.

A silicon nitride (SiN) film can be interposed between the interlayer insulation film and barrier metal.

In the first and second embodiments, the tungsten carbide (WC) film is formed by CVD. The WC film can be formed by ion-implanting carbon (C) into the tungsten film and carbonizing the surface of the tungsten film by heat treatment. The WC film can also be formed by argon (Ar) sputtering using tungsten carbide as a target or by formation sputtering using a mixture gas of Ar and C such as $CF_4$ and using tungsten as a target. Otherwise, it can be formed by forming a tungsten film, rendering gas including carbon plasmatic, and carbonizing the surface of the tungsten film by the plasma.

In the above embodiments, the Xe—Cl excimer laser is employed for the heat treatment of copper. However, furnace anneal and rapid thermal anneal in a vacuum or gas can be used.

It is needless to say that various changes and modifications can be made without departing from the scope of the subject matter of the present invention.

As has been described in detail, according to the present invention, the wettability and adhesion of the copper film to the barrier metal can be improved. Therefore, even though the surface of the barrier metal includes an exposed portion which is not sufficiently covered with the copper film, the hole and groove can completely be filled with the copper film by the subsequent heat treatment. Consequently, a semiconductor device having a wiring layer using copper with high reliability can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A method for manufacturing a semiconductor device, comprising:
    forming an interlayer insulation film on a semiconductor layer;
    forming an opening portion in the interlayer insulation film, the opening portion reaching a conductive portion underlying the interlayer insulation film;
    forming a first metal film on a surface of a resultant structure including the interlayer insulation film by stacking, in order, a titanium film, a titanium nitride film, a tungsten film, and a tungsten carbide film;
    forming a second metal film on the first metal film, the second metal film containing at least copper as a principal ingredient; and
    melting the second metal film and burying the melted second metal film into the opening portion.

2. The method according to claim 1, wherein the interlayer insulation film has a dielectric constant ranging from 1.0 to 3.9.

3. The method according to claim 1, further comprising flattening a surface of the interlay insulation film.

4. The method according to claim 1, wherein the interlayer insulation film has a thickness of about 1.5 $\mu$m, and the opening portion is a contact hold having a size of about 0.5 $\mu$m square, the contact hold being formed in the interlayer insulation film by a photoetching process.

5. The method according to claim 4, wherein the contact hold has an aspect ratio of 2.5 or more.

6. The method according to claim 1, further comprising forming the titanium film, the titanium nitride film, the tungsten film, the tungsten carbide film continuously in a vacuum by CVD.

7. The method according to claim 1, further comprising forming the tungsten carbide film by thermally treating a carbon-ion-implanted tungsten film and carbonizing a surface thereof.

8. The method according to claim 1, further comprising forming the tungsten carbide film by argon sputtering using tungsten carbide as a target.

9. The method according to claim 1, further comprising forming the tungsten carbide film by formation sputtering using tungsten as a target.

10. The method according to claim 1, further comprising forming the tungsten carbide film by carbonizing a tungsten film by plasma.

11. The method according to claim 1, further comprising forming a SiN film between the interlayer insulation film and the first metal film.

12. The method according to claim 1, further comprising forming the second metal film as a copper film formed by sputtering in a vacuum.

13. The method according to claim 1, further comprising instantaneously melting the second metal film by irradiation of a laser beam.

14. The method according to claim 1, further comprising instantaneously melting the second metal film by furnace annealing.

15. The method according to claim 1, further comprising instantaneously melting the second metal film by rapid thermal annealing.

16. The method according to claim 1, further comprising treating the first metal film and the second metal film to bury the first metal film and the second metal film only into the opening portion to form a buried wiring layer.

17. The method according to claim 16, further comprising forming a plurality of buried wiring layers by repeating the respective steps.

18. The method according to claim 1, further comprising treating the first metal film and the second metal film to project part of each of the first metal film and the second metal film from the opening portion to form a projected wiring layer.

19. The method according to claim 18, further comprising forming a plurality of projected wiring layers by repeating the respective steps.

20. A method for manufacturing a semiconductor device, comprising:
    forming an interlayer insulation film on a semiconductor layer;
    forming a contact hole in the interlayer insulation film, the contact hole reaching a conductive portion underlying the interlayer insulation film;
    forming a wiring groove in the interlayer insulation film, the wiring groove being formed in a region which includes the contact hole;
    forming a first metal film on a surface of a resultant structure including the interlayer insulation film by stacking, in order, a titanium film, a titanium nitride film, a tungsten film, and a tungsten carbide film;
    forming a second metal film on the first metal film, the second metal film containing at least copper as a principal ingredient; and
    melting the second metal film and burying the melted second metal film into the opening portion.

21. The method according to claim 20, wherein the interlayer insulation film has a dielectric constant ranging from 1.0 to 3.9.

22. The method according to claim 20, further comprising flattening a surface of the interlayer insulation film.

23. The method according to claim 20, wherein the interlayer insulation film has a thickness of about 1.5 $\mu$m, and the opening portion is a contact hole having a size of about 0.5 $\mu$m square, the contact hole being formed in the interlayer insulation film by a photoetching process.

24. The method according to claim 23, wherein the contact hole has an aspect ratio of 2.5 or more.

* * * * *

UNITED STATES PATENT AND TRADEMARK OFFICE
CERTIFICATE OF CORRECTION

PATENT NO. : 6,812,136 B2  
DATED : November 2, 2004  
INVENTOR(S) : Koyama et al.

Page 1 of 1

It is certified that error appears in the above-identified patent and that said Letters Patent is hereby corrected as shown below:

Title page,  
Item [63], Related U.S. Application Data, change "08/950,756" to -- 08/950,757 --.

Column 9,  
Line 40, change "interlay" to -- interlayer --.  
Lines 43, 44 and 47, change "hold" to -- hole --.  
Line 50, change "film, the" to -- film, and the --.

Signed and Sealed this

Eighth Day of February, 2005

JON W. DUDAS  
*Director of the United States Patent and Trademark Office*